United States Patent
Kameyama et al.

(10) Patent No.: US 7,264,997 B2
(45) Date of Patent: Sep. 4, 2007

(54) SEMICONDUCTOR DEVICE INCLUDING INCLINED CUT SURFACE AND MANUFACTURING METHOD THEREOF

(75) Inventors: Koujiro Kameyama, Gunma (JP); Kiyoshi Mita, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 170 days.

(21) Appl. No.: 10/892,483

(22) Filed: Jul. 16, 2004

(65) Prior Publication Data

US 2005/0012187 A1    Jan. 20, 2005

(30) Foreign Application Priority Data

Jul. 16, 2003   (JP) .............................. 2003-197860

(51) Int. Cl.
*H01L 21/00* (2006.01)
(52) U.S. Cl. .................. 438/113; 438/114; 257/678; 257/692
(58) Field of Classification Search ............. 438/110, 438/113, 114; 257/678, 692, 701
See application file for complete search history.

(56) References Cited

U.S. PATENT DOCUMENTS

| | | | |
|---|---|---|---|
| 6,294,439 B1* | 9/2001 | Sasaki et al. | 438/464 |
| 6,400,006 B2* | 6/2002 | Neu et al. | 257/678 |
| 6,624,505 B2* | 9/2003 | Badehi | 257/678 |
| 6,777,767 B2* | 8/2004 | Badehi | 257/432 |
| 6,972,480 B2* | 12/2005 | Zilber et al. | 257/678 |
| 2001/0021543 A1* | 9/2001 | Neu et al. | 438/110 |
| 2003/0080398 A1* | 5/2003 | Badehi | 257/678 |

FOREIGN PATENT DOCUMENTS

JP   2003-031753   1/2003

* cited by examiner

*Primary Examiner*—Fernando L. Toledo
(74) *Attorney, Agent, or Firm*—Fish & Richardson P.C.

(57) ABSTRACT

A semiconductor device comprises a semiconductor element and electrodes electrically connected to the semiconductor element, the semiconductor element and the electrodes being sealed by a sealing agent having an insulating property, the electrodes being exposed around a mounting surface that is joined via a joining agent to an external mounting circuit board, wherein the electrodes are shaped so that the joining agent is visually identifiable from side surfaces surrounding the mounting surface when the mounting surface is joined via the joining agent to the mounting circuit board.

31 Claims, 8 Drawing Sheets

SEMICONDUCTOR DEVICE INCLUDING INCLINED CUT SURFACE AND MANUFACTURING METHOD THEREOF

CROSS-REFERENCE TO RELATED APPLICATIONS

The present application claims priority upon Japanese patent application No. 2003-197860 filed on Jul. 16, 2003, which is herein incorporated by reference.

BACKGROUND OF THE INVENTION

1. Field of the Invention

The present invention relates to a semiconductor device with enhanced visual identifiability of a joining agent deposited on external terminals, and to a method of manufacturing the semiconductor device.

2. Description of the Related Art

In response to recent demands for smaller and slimmer semiconductor devices, nonleaded semiconductor devices have been proposed such as VQFN (Very Thin Quad Flat Nonleaded Package) and VSON (Very Thin Small Outline Nonleaded Package) in which external terminals are exposed from the package bottom surface. See Japanese patent application Laid-open Publication No. 2003-31753.

FIG. 14 is a perspective view showing a mounting surface of a conventional VQFN semiconductor device 100. As shown in this figure, a plurality of external terminals (bonding pads) 106 are exposed at given pad pitches on a circumferential portion of the mounting surface of the conventional semiconductor device 100.

FIG. 15 is a sectional view showing the mounting condition of the conventional semiconductor device 100 to a printed wired board 200. An upper surface portion of the printed wired board 200 is coated with a solder resist 201 to prevent a joining agent 300 such as solder from being deposited on any portions other than conductive pattern. Portions not coated with the solder resist 201 serve as lands 202 as conductive pattern.

In such a case, the external terminals 106 of the conventional semiconductor device 100 are joined via the joining agent 300 to the lands 202 of the printed wired board. It is to be noted that spacings between the external terminals 106 (pad pitches) have been made narrower in response to demands for finer pitches (narrower pad pitches), thus rendering the adjacent external terminals 106 more vulnerable to a so-called solder bridge by which the joining agent 300 deposited on each of the external terminals 106 overlaps with each other. To prevent this solder bridge, the amount of the joining agent 300 deposited on the external terminals 106 is kept to a minimum.

Incidentally, following mounting of the semiconductor device to the printed wired board, fillets (shapes) of the joining agent 300 formed between the external terminals 106 and the lands 202 are shown on monitor using a CCD camera or something similar provided in a given inspection device. Based on the image shown on a monitor, a pass/fail judgment is made through visual check on the joining condition of the external terminals 106 and the lands 202 via the joining agent 300.

In the case of nonleaded semiconductor devices such as VQFN, however, the external terminals 106 are arranged exposed on the mounting surface (package's rear surface), with the amount of the joining agent 300 kept to a minimum for finer pitches. This results in difficulties in visually checking the shape of the joining agent 300, thus making a pass/fail judgment difficult on the joining condition of the external terminals 106 and the lands 202.

SUMMARY OF THE INVENTION

In light of the above, it is an object of the present invention to provide a semiconductor device with enhanced visual identifiability of a joining agent deposited on external terminals and a method of manufacturing the semiconductor device.

In order to achieve the above object, according to a first aspect of the present invention there is provided a semiconductor device comprising a semiconductor element and electrodes electrically connected to the semiconductor element, the semiconductor element and the electrodes being sealed by a sealing agent having an insulating property, the electrodes being exposed around a mounting surface that is joined via a joining agent to an external mounting circuit board, wherein the electrodes are shaped so that the joining agent is visually identifiable from side surfaces surrounding the mounting surface when the mounting surface is joined via the joining agent to the mounting circuit board. In the case where the semiconductor device is joined to the mounting circuit board via the joining agent, the condition of the joining agent becomes visually identifiable from the side surfaces of the semiconductor device, making it readily possible to make a pass/fail judgment on the condition of the joining agent through visual check.

In order to attain the above object, according to a second aspect of the present invention there is provided a method of manufacturing a semiconductor device, comprising a sealing step of sealing electrodes and a semiconductor element, that are electrically connected to each other, with a sealing agent having an insulating property in each of partitioned regions partitioned on a conductive foil, with the electrodes exposed around a mounting surface joined via a joining agent to a mounting circuit board; a cutting step of removing an edge portion on each of the electrodes, close to a boundary portion of each of the partitioned regions toward the mounting surface, by moving a first blade over a given length vertically relative to the mounting surface for cutting; and a separation step of separating each of the partitioned regions after removal of the edge portions.

Other features of the present invention will become more apparent from the accompanying drawings and the following description of the present invention.

DESCRIPTION OF THE PREFERRED EMBODIMENTS

Embodiments of the present invention will be described specifically hereinbelow with reference to the attached drawings.

<Configuration of Semiconductor Device>

Figure 1:
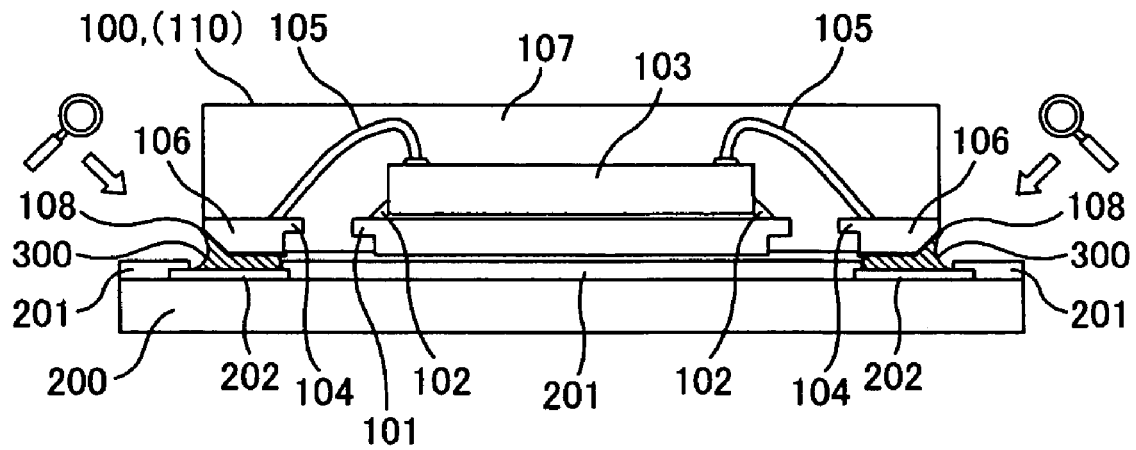
FIG. 1 is a sectional view showing the mounting condition of a semiconductor device according to an embodiment of the present invention.

FIG. 1 is a sectional view showing the mounting condition of the semiconductor device 100 according to the present invention to the printed wired board 200 ("mounting circuit board"). It is to be noted that, as with nonleaded semiconductor devices such as VQFN and VSON, the semiconductor device 100 takes on a shape in which bonding pads ("electrodes") 104 serving as the external terminals 106 are exposed on the mounting surface (bottom surface) that is joined to the printed wired board 200 via the joining agent 300.

On a die pad 101 made of copper, etc., a semiconductor element 103 is fastened (die-bonded) via a die-bonding joining agent 102 such as Ag (silver) paste, solder or adhesive. There are formed electrode pads (not shown) on the surface of the semiconductor element 103, with the electrode pads and the bonding pads 104, made of copper or other material, electrically connected (wire-bonded) via metal thin wires 105. It is to be noted that while the bonding pads 104 adopt a shape having a protruding portion on the side of the upper surface of the semiconductor device 100 for enhanced adhesion to a sealing agent 107 (anchor effect), the bonding pads 104 maybe naturally shaped without the protruding portion.

Being electrically connected to each other, the die pad 101, the semiconductor element 103 and the bonding pads 104 are sealed by the sealing agent 107 having an insulating property, thus forming a sealed body 110. It is to be noted that thermosetting resin such as epoxy resin (in the case of transfer molding method) and thermoplastic resin such as polyimide resin and poly phenylene sulfide (in the case of injection molding method) are among agents that can be used as the sealing agent 107.

After sealing, the bottom surface of the die pad 101 may be unexposed or exposed on the mounting surface of the sealed body 110. When the bottom surface of the die pad 101 is unexposed, insulating property of the die pad 101 and the semiconductor element 103 is reliably protected. When the bottom surface of the die pad 101 is exposed, the semiconductor device 100 can be made thinner as much as the bottom surface is not sealed. It is also possible to emit heat, generated from the semiconductor device 100, from the bottom surface of the die pad 101.

Following sealing, the bottom surfaces of the bonding pads 104 are exposed on the mounting surface of the sealed body 110. Here, portions of the bonding pads 104, exposed on the mounting surface of the sealed body 110, form the external terminals 106 for joining (mounting) the semiconductor device 100 to the printed wired board 200 via the joining agent 300.

On the external terminals 106, there is formed a plated layer 108 such as solder-plated or metal-plated (e.g., Ni (nickel), Ag (silver)) layer. It is to be noted that the side surfaces of the bonding pads 104 facing the side surfaces of the sealed body 110 may also be exposed for enhanced volume of the shape of the joining agent 300.

The printed wired board 200 is a circuit board designed to mount the semiconductor device 100, with the upper surface opposing the mounting surface of the semiconductor device 100 coated with the solder resist 201. It is to be noted that the solder resist 201 is a coating for preventing deposition of the joining agent 300 such as solder on any portions other than conductive pattern on the printed wired board 200. On the other hand, portions not coated with the solder resist 201 serve as the lands 202 as conductive pattern. That is, when the semiconductor device 100 is mounted onto the printed wired board 200, the joining agent 300 is deposited between the external terminals 106 and the lands 202. It is to be noted that lands (not shown) other than the external terminals 106 of the semiconductor device 100 may be joined to the lands 202 of the printed wired board 200 via the joining agent 300.

Incidentally, the semiconductor device 100 according to the present invention takes on a shape in which the joining agent 300 is visually identifiable from the side surfaces surrounding the mounting surface of the semiconductor device 100 when the mounting surface is joined to the printed wired board 200 via the joining agent 300. Such a shape taken on by the semiconductor device 100 renders visually identifiable the shape of the joining agent 300 formed between the external terminals 106 and the lands 202 when the semiconductor device 100 is mounted, facilitating a pass/fail judgment on the condition of the joining agent 300 in an inspection step.

Figure 2:
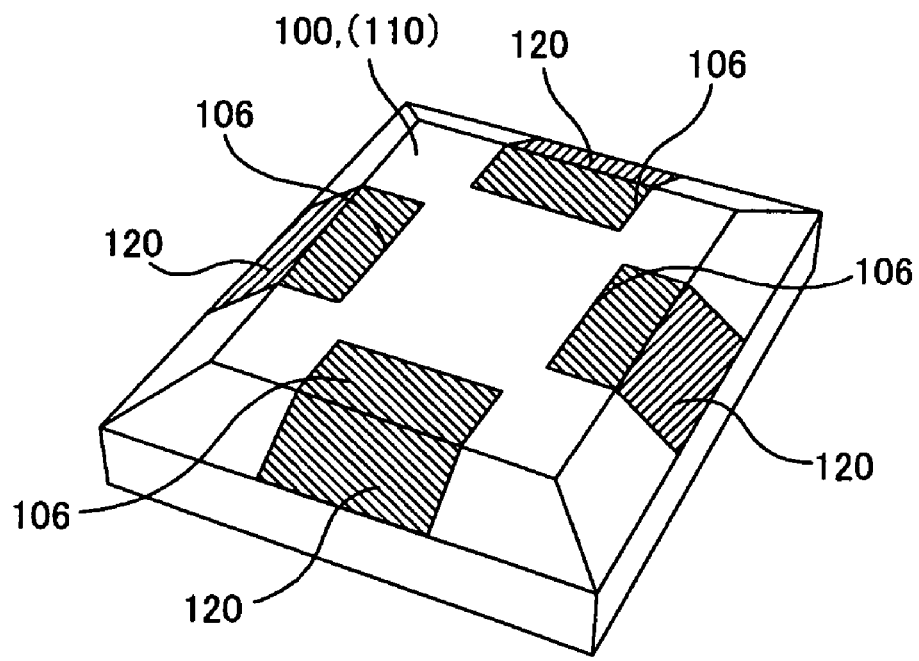
FIG. 2 is a perspective view showing a mounting surface of the semiconductor device according to the embodiment of the present invention.

It is to be noted that FIG. 2 is a perspective view, seen from the side of the mounting surface, showing an embodiment of the semiconductor device 100 according to the present invention. As shown in this figure, the semiconductor device 100 may take on a shape in which cut surfaces 120, linearly inclined relative to the mounting surface, and may be formed by removing edge portions close to the side surfaces including the external terminals 106 on the mounting surface. Such a shape taken on by the semiconductor device 100 makes it readily possible, when the semiconductor device 100 is mounted to the printed wired board 200, to visually identify the condition of the joining agent 300 from a slanting upper direction of the semiconductor device 100 along the direction of the angle of the inclination.

Figure 3:
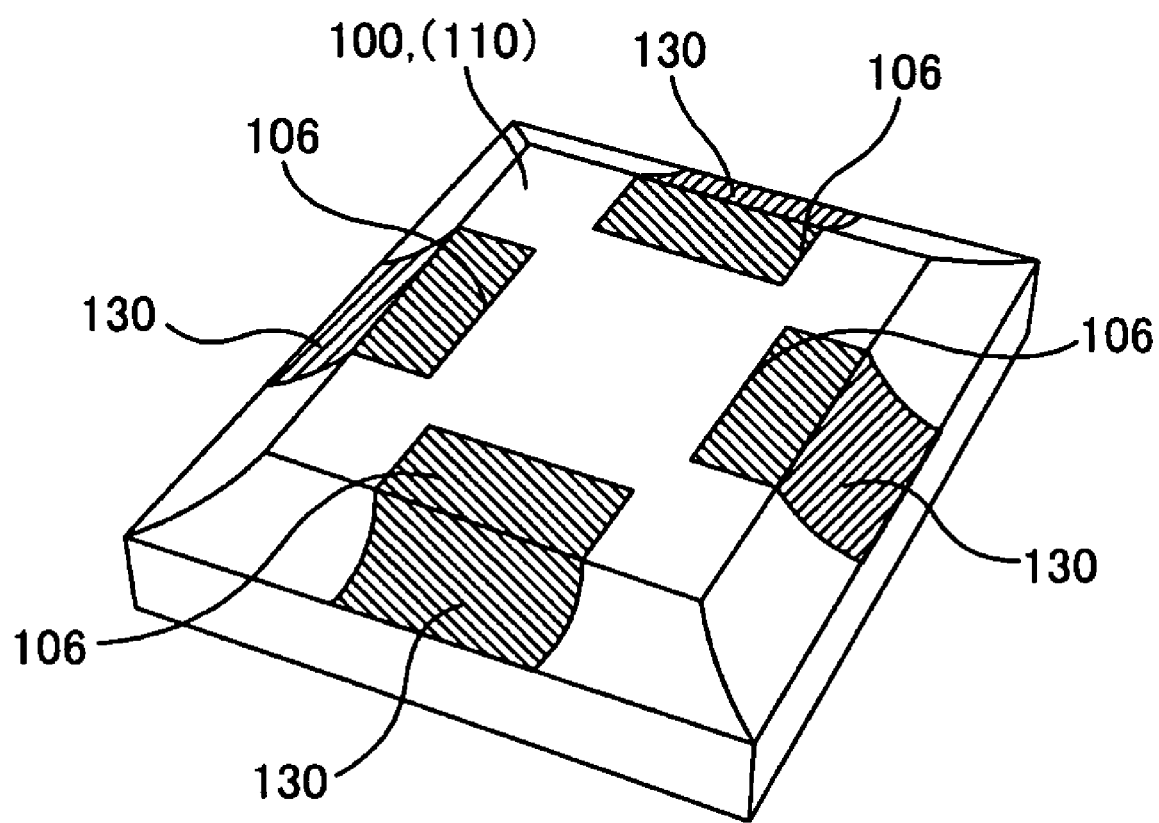
FIG. 3 is a perspective view showing the mounting surface of the semiconductor device according to the embodiment of the present invention.

FIG. 3 is a perspective view, seen from the side of the mounting surface, showing another embodiment of the semiconductor device 100 according to the present invention. As shown in this figure, the semiconductor device 100 may take on a shape in which the cut surfaces 120, curvedly inclined relative to the mounting surface, and may be formed by removing the edge portions close to the side surfaces including the external terminals 106 on the mounting surface. Such a shape taken on by the semiconductor device 100 makes it readily possible, when the semiconductor device 100 is mounted to the printed wired board 200, to visually identify the condition of the joining agent 300 from a slanting upper direction of the semiconductor device 100, as with the shape having the linearly inclined cut surfaces 120. The shape allows more of the joining agent 300 to be deposited, as compared with the shape having the linearly inclined cut surfaces 120, because of the curved inclination, thus providing improved joining strength.

<Manufacturing Method of the Semiconductor Device>

Figure 4:
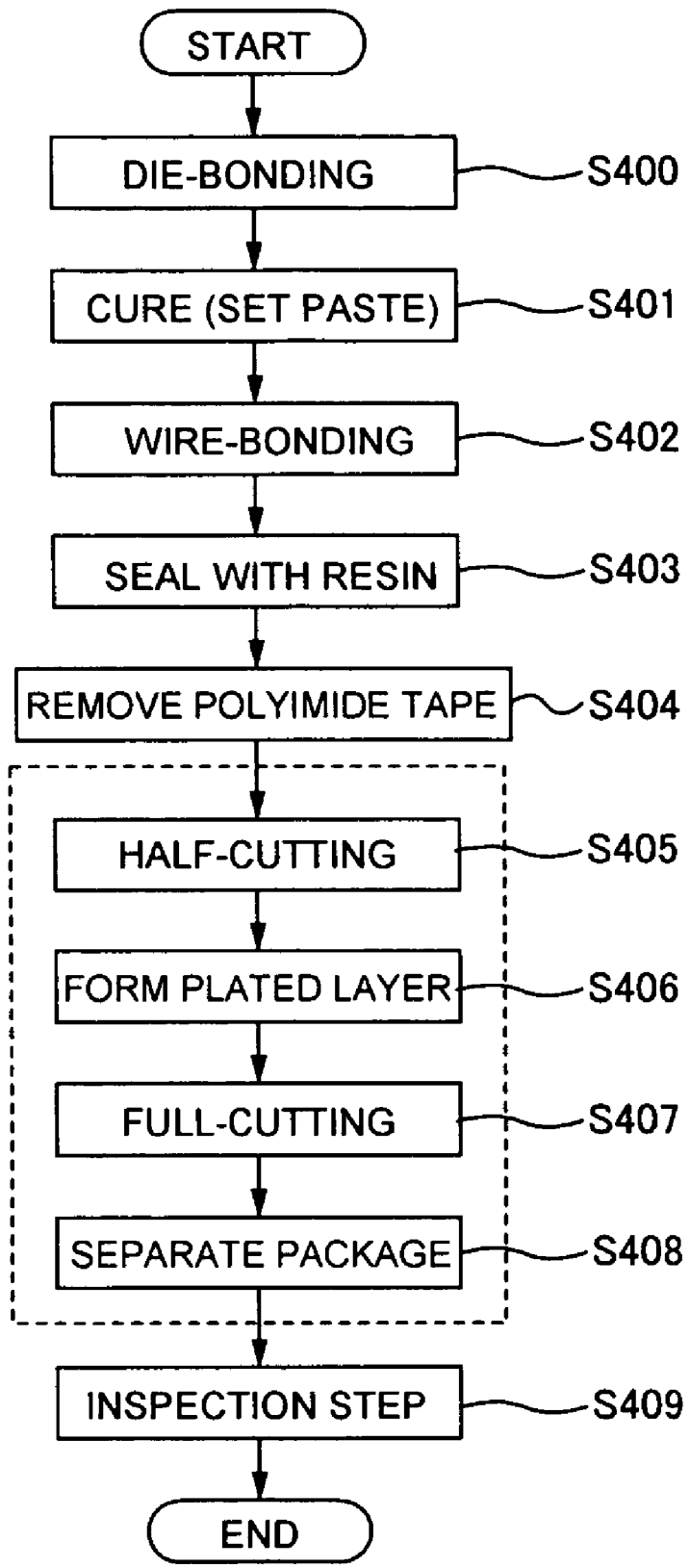
FIG. 4 is a flowchart of manufacturing steps of the semiconductor device according to the embodiment of the present invention.
Figure 5:
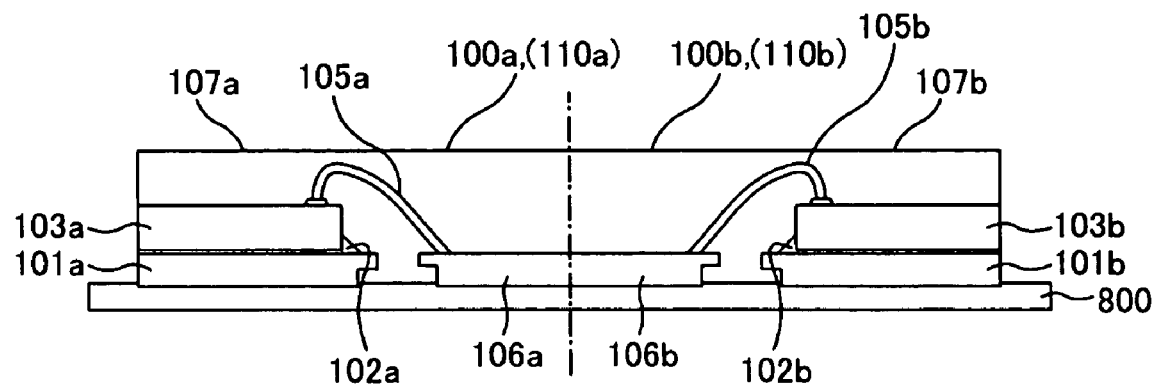
FIG. 5 is a view explaining a manufacturing step of the semiconductor device according to the embodiment of the present invention.

A description will be made about the manufacturing method of the semiconductor device 100 according to the present invention, referring as appropriate to FIGS. 5 to 12 and based on the flowchart in FIG. 4.

Die Bonding to Sealing

First, a conductive foil 700 in plate form, made of Cu (copper) or Al (aluminum) or an alloy such as Fe—Ni, is made available. Then, after formation of a resist pattern on the conductive foil 700, etching is performed using the resist pattern as a mask, thus forming the desired die pad 101 and bonding pads 104 in each of partitioned regions partitioned on the conductive foil 700. It is to be noted that the bonding pads 104 are formed such that a given number thereof are arranged around each of the partitioned regions of the conductive foil 700. The bonding pads 104 in the adjacent partitioned regions must be formed connected to each other.

Next, the semiconductor element 103, diced from a silicon wafer, etc. in advance, is fastened (die-bonded) onto the die pad 101 formed in each of the partitioned regions of the conductive foil 700 via the joining agent 102 (S400). Then, after thermosetting of the joining agent 102 by a curing step (S401), the electrodes of the semiconductor element 103 (not shown) and the bonding pads ("electrodes") 106, formed around each of the partitioned regions of the conductive foil 700, are electrically connected (wire-bonded) via the metal thin wires 105 (S402).

Then, the conductive foil 700 is sealed as a whole, with the bonding pads 104 exposed as the external electrodes 106 around the mounting surface (the surface joined to the printed wired board 200 via the joining agent 300) of each of the partitioned regions of the conductive foil 700 (S403). This results in formation of the sealed body 110 sealed by the sealing agent 107 except for the bonding pads 104 exposed around each of the mounting surfaces of the conductive foil 700.

Incidentally, if sealing is performed with a resin sheet 800 affixed to the mounting surface of the conductive foil 700, the sheet 800 will prevent sealing of the mounting surface of the bonding pads 104 by the sealing agent 107. Further, it becomes easier for the external terminals 106 to be exposed on the mounting surfaces of the sealed body 110 as a result of pressurization of the sealing agent 107 via the resin sheet 800 in a sealing step (S403). Therefore, it is preferred that the resin sheet 800 is affixed in advance to the conductive foil 700 prior to the sealing step (S403) (see FIG. 5). It is to be noted that if the resin sheet 800 is employed, a step is required for removing the resin sheet 800 from the conductive foil 700 following the sealing step (S403).

Half-Cutting to Inspection Steps

A description will be given below of steps from half-cutting to inspection, steps characteristic to manufacturing steps of the semiconductor device 100 according to the present invention.

Figure 6:
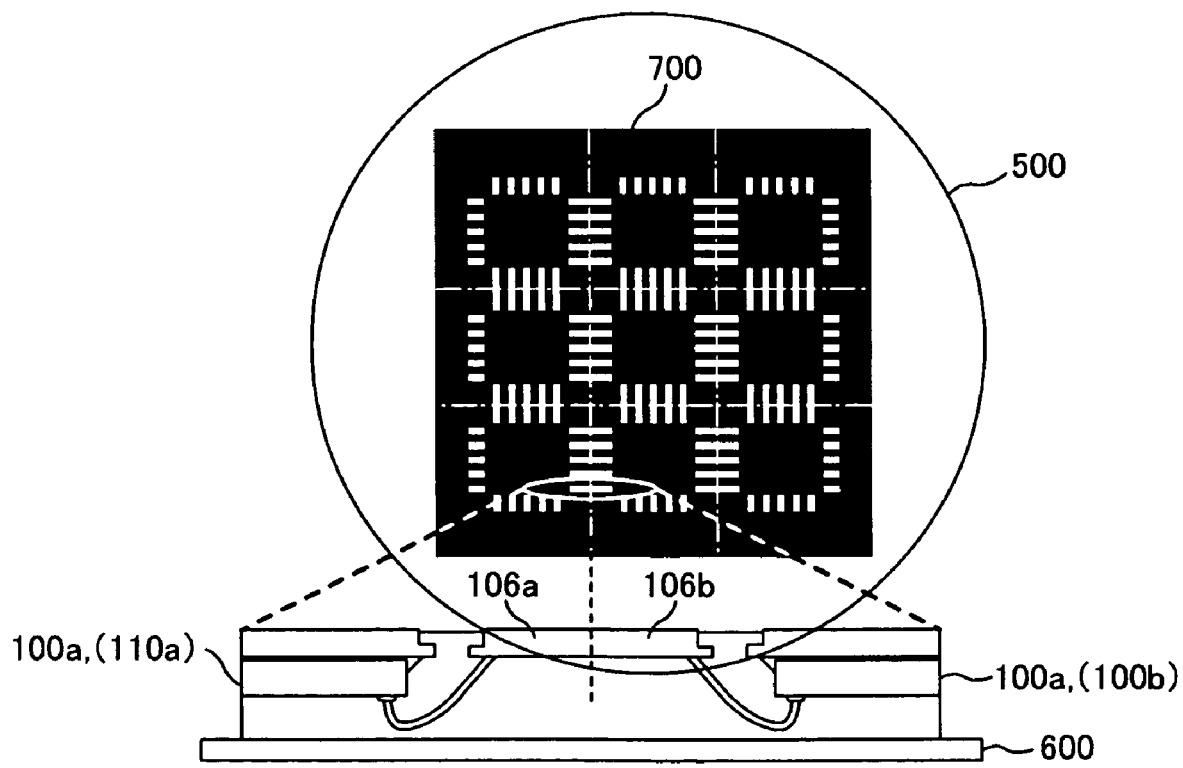
FIG. 6 is a view explaining a manufacturing step of the semiconductor device according to the embodiment of the present invention.
Figure 7:
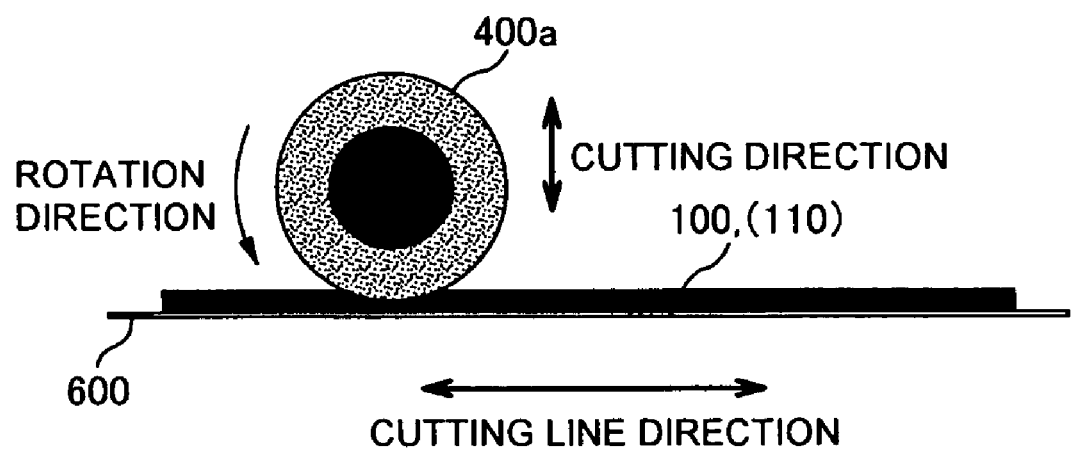
FIG. 7 is a view explaining a manufacturing step of the semiconductor device according to the embodiment of the present invention.
Figure 8A:
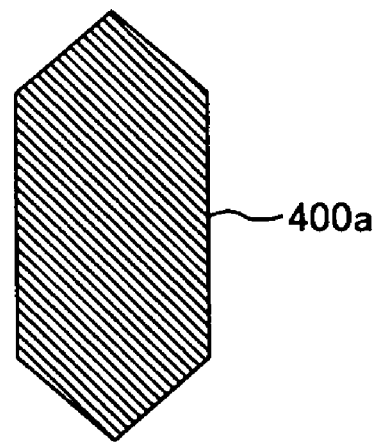
FIGS. 8A and 8B are views explaining shapes of a cutting blade according to the embodiment of the present invention.
Figure 8B:
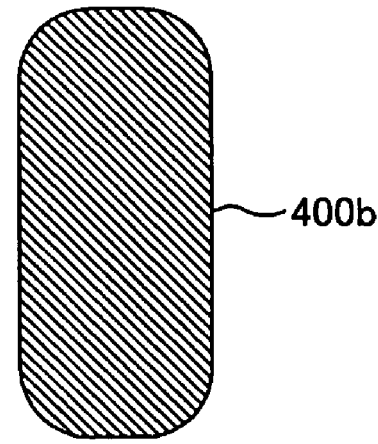

First, a dicing sheet 600 made of polyolefin, etc. is affixed in advance to the surface (upper surface) of the conductive foil 700 (hereinafter referred to as "unit"), a surface completely reverse to the mounting surface after sealing, as shown in FIG. 6. Then, the unit 700 is fastened (bonded) onto a work table 500 provided in a dicing device (not shown) through vacuum suction such that the edge of a cutting blade ("first blade") 400, that will be described later, provided in the dicing device, and the mounting surface of the unit 700 are opposite to each other. It is to be noted that the dicing sheet 600 makes it easier to keep the unit 700 fastened.

Next, the cutting blade 400 is positioned upward of a cutting line (boundary portion of each of the partitioned regions) in the mounting surface of the unit 700, and then moved over a given length in the cutting direction vertical relative to the mounting surface. Thus, a half-cutting step (S405) is performed by first positioning the cutting blade 400 and then rotating and driving the blade with a spindle motor (not shown), etc. while at the same time moving the unit 700, fastened to the work table 500, in the direction along the cutting line.

Here, the cutting blade 400 refers to a blade for cutting the edge portions close to the side surfaces of the semiconductor device 100 including the external terminals 106 at the boundary portions on the mounting surface of the unit 700, in order to form the cut surfaces (e.g., 120 or 130) for visual identification of the joining agent 300, deposited between the external terminals 106 and the lands 202 of the printed wired board 200, from the side surfaces of the semiconductor device 100. Among blades that can be used as the cutting blade 400 are a blade 400a having a V-shaped edge (see FIG. 8A) and a blade 400b having a U-shaped edge (see FIG. 8B).

It is to be noted that when the cutting blade 400a is used having a V-shaped edge, the boundary portion on the mounting surface of the unit 700 is shaped into a V notch. As a result, the shape of the semiconductor device 100, including the external terminals 106 cleared of the edge portions close to the side surfaces, is inclined linearly relative to the mounting surface. On the other hand, when the cutting blade 400b is used having a U-shaped edge, the boundary portion on the mounting surface of the unit 700 is shaped into a U notch. As a result, the shape of the semiconductor device 100, including the external terminals 106 cleared of the edge portions close to the side surfaces, is inclined curvedly relative to the mounting surface.

Figure 9:
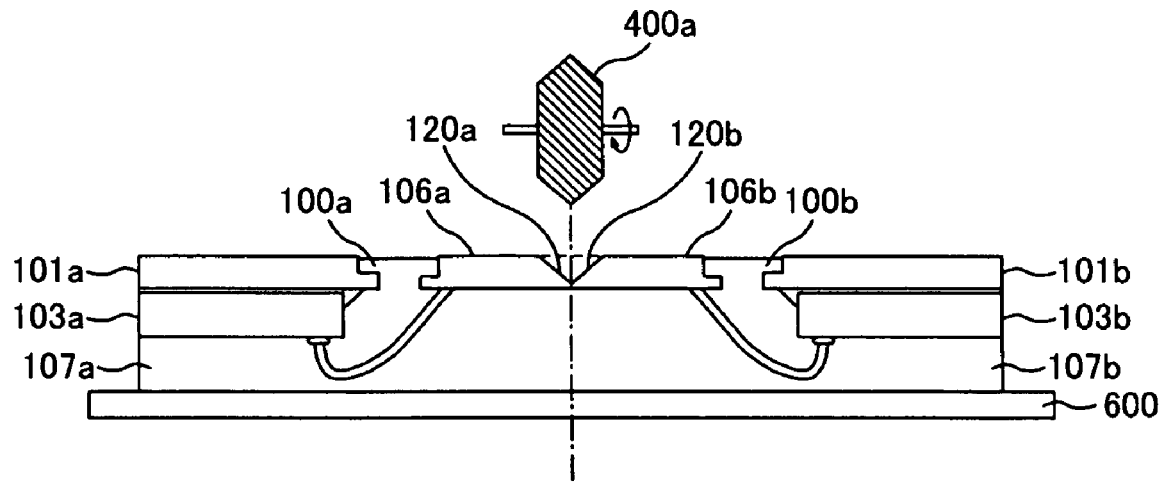
FIG. 9 is a view explaining a manufacturing step of the semiconductor device according to the embodiment of the present invention.
Figure 10:
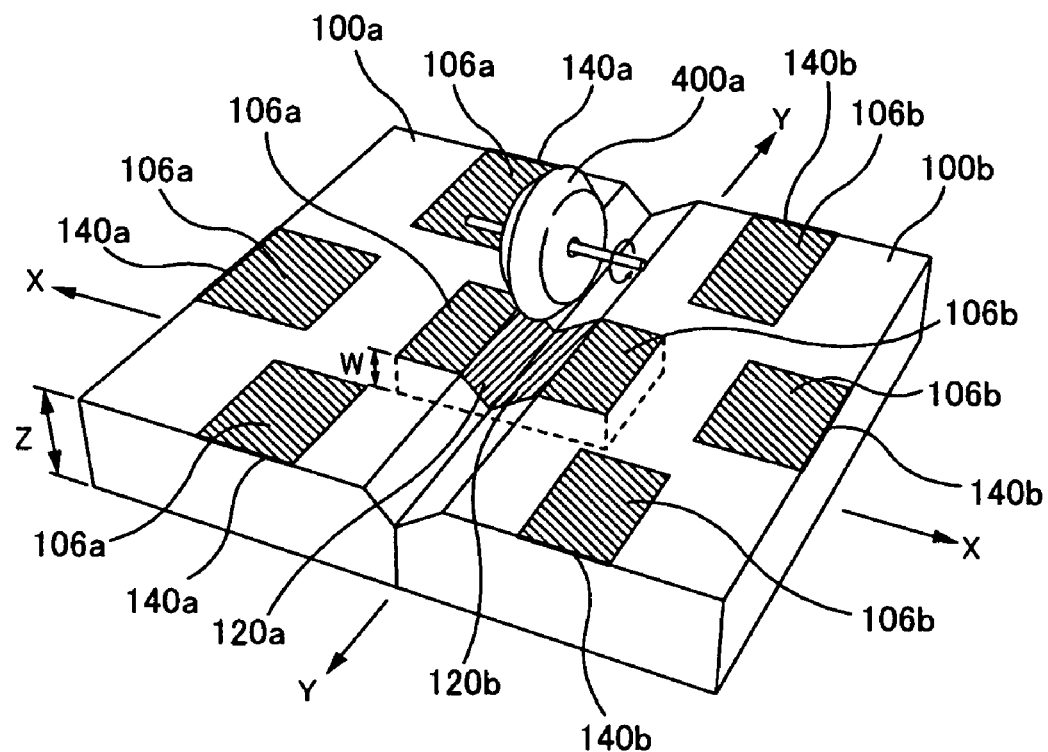
FIG. 10 is a view explaining a manufacturing step of the semiconductor device according to the embodiment of the present invention.

A description will be made about a detailed embodiment of the half-cutting step (S405) using a sectional view of the semiconductor device 100 shown in FIG. 9 and a perspective view of the semiconductor device 100 shown in FIG. 10. It is to be noted that the cutting blade 400a with a V-shaped edge is used as the cutting blade 400. Semiconductor devices 100a and 100b shown in FIGS. 9 and 10 represent those arranged adjacent to each other via the boundary portion of the unit 700. Further, external terminals 106a and 106b of the respective semiconductor devices 100a and 100b are exposed connected with each other at the boundary portion on the mounting surface of the unit 700 (see FIG. 6).

First, the direction orthogonal to the rotational axis of the cutting blade 400a is matched with the direction of the cutting line (Y direction shown in FIG. 10), a boundary portion between the semiconductor devices 100a and 100b, for example, by rotating and driving the work table 500 fastened to the unit 700 with a rotation mechanism (not shown) provided in the dicing device. Then, after the cutting blade 400a is moved and adjusted to the direction parallel with the rotational axis of the cutting blade 400a (X direction shown in FIG. 10) such that the cutting blade 400a is positioned at an initial position upward of the boundary portion between the semiconductor devices 100a and 100b, the cutting blade 400a is moved over a given length in the cutting direction vertical relative to the mounting surface (Z direction shown in FIG. 10), thus completing the positioning of the cutting blade 400a.

Next, the cutting blade 400a is moved in the direction of the cutting line (Y direction shown in FIG. 10), the boundary portion between the semiconductor devices 100a and 100b, by rotating and driving the cutting blade 400a, thus forming a V-notched groove in the boundary portion between the semiconductor devices 100a and 100b. At this time, it is to be noted that, on the external terminals 106a and 106b located on the boundary portion between the semiconductor devices 100a and 100b, edge portions 140a and 140b are cut that are close to the side surfaces of the semiconductor devices 100a and 100b.

The aforementioned step is performed in all the cutting lines in the mounting surfaces of the unit 700, thus completing the half-cutting step.

It is to be noted that, in consideration of a plated layer formation step (S406) according to the electrolytic plating method described later, the cutting blade 400a may be moved halfway in the direction of the thickness of the external terminals 106a and 106b (W direction shown in FIG. 10) when the blade is moved in the cutting direction (Z direction shown in FIG. 10). This prevents the external terminals 106a and 106b from being completely separated, keeping the terminals electrically connected.

Figure 11:
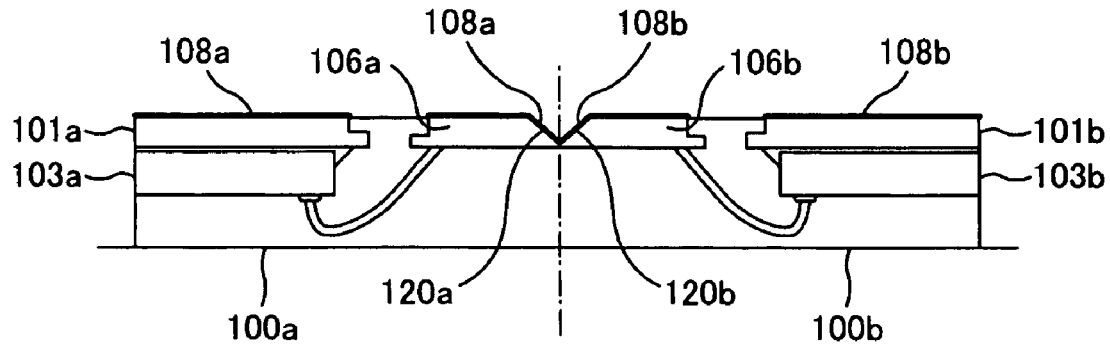
FIG. 11 is a view explaining a manufacturing step of the semiconductor device according to the embodiment of the present invention.

Following the half-cutting step (S405) and removal of the dicing sheet 600, plated layers 108a and 108b are formed, based on the electrolytic plating method, on the external terminals 106a and 106b including cut surfaces 120a and 120b that are linearly inclined as shown in FIG. 11 (S406) It is to be noted that the electrolytic plating method refers to a method for forming plated layers by providing anode and cathode electrodes in an electrolytic solution such as copper plating bath, arranging an object to be plated as a cathode electrode and applying a voltage between the electrodes, thus allowing electrons to precipitate on the surface of the object to be plated.

Here, the external terminals 106a and 106b are not completely separated by the half-cutting step (S405) and remain electrically connected, as described above. For this reason, it is possible to form a plated layer on all the external terminals 106 at one time within the unit 700, including the semiconductor devices 100a and 100b, by carrying out the electrolytic plating method after connecting the given external terminals 106 to the cathode electrode terminal.

The plated layer formation step (S406) is followed by a full-cutting step (S407) for separating each of the semiconductor devices 100 from the unit 700. It is to be noted that the full-cutting step is conducted using the dicing device (not shown) as in the half-cutting step (S405) described earlier.

Figure 12:
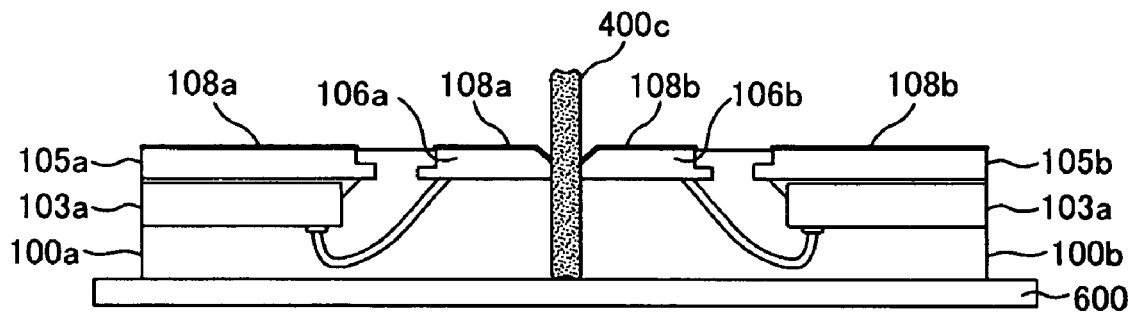
FIG. 12 is a view explaining a manufacturing step of the semiconductor device according to the embodiment of the present invention.

More specifically, after the dicing sheet 600 is affixed again to the upper surface of the conductive foil 700, a surface on which the plated layers 108a and 108b are formed, completely reverse to the mounting surface, the unit 700 is fastened onto the work table 500 provided in the dicing device through vacuum suction. Then, as shown in FIG. 12, the unit 700 is diced by manipulating a separation blade ("second blade") 400c, narrower in blade width than the cutting blade 400a, thus separating each of the semiconductor devices 100 (S408). Then, the individual separated semiconductor devices 100 are subjected to an inspection step (S409) for visual, process, electrical characteristic and other inspections, after which only those semiconductor devices screened as acceptable will be eventually shipped.

In the semiconductor device 100 thus manufactured, the condition of the joining agent 300 is visually identifiable from the side surfaces of the semiconductor device 100 when the semiconductor device 100 is mounted to the printed wired board 200 by depositing the joining agent 300 between the external terminals 106 and the lands 202 as shown in FIG. 1. This facilitates pass/fail judgment on the condition of the joining agent through visual check. This allows more of the joining agent 300 to be deposited because of the cut edge portions, thus providing improved visual identifiability and joining strength of the joining agent 300.

While the embodiments of the present invention have been specifically described based on the embodiments, the present invention is not limited thereto and various changes and modifications may be made without departing from the spirit of the invention.

Figure 13:
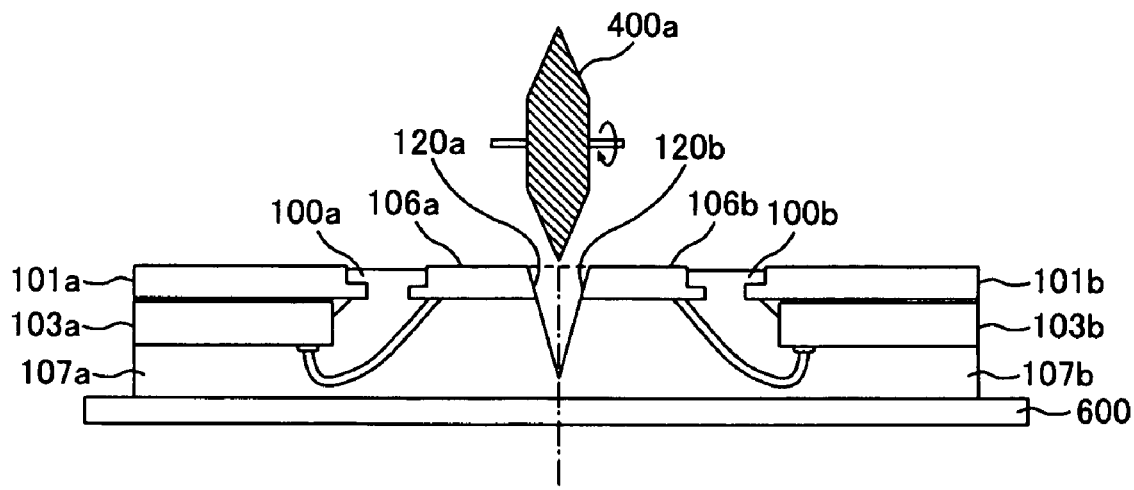
FIG. 13 is a view explaining a manufacturing step of the semiconductor device according to an embodiment of the present invention.
Figure 14:
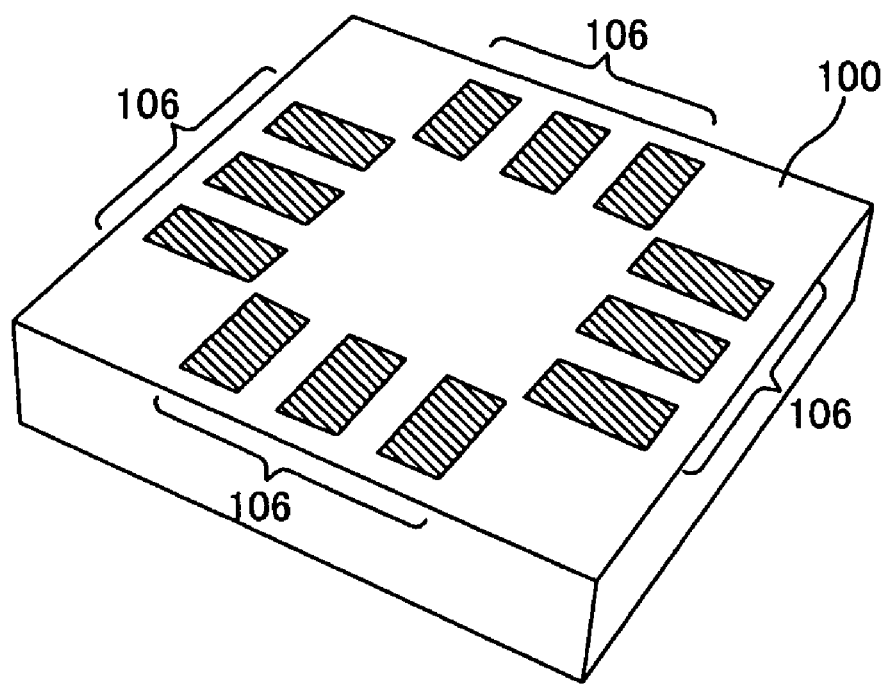
FIG. 14 is a perspective view showing the mounting surface of a conventional semiconductor device.
Figure 15:
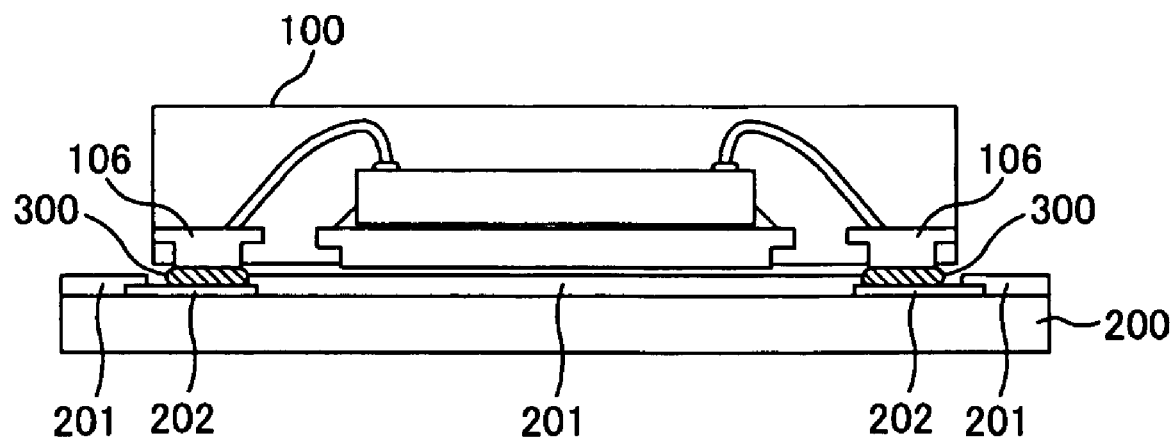
FIG. 15 is a sectional view showing the mounting condition of the conventional semiconductor device.

As shown in FIG. 13, for instance, the individual semiconductor devices may be separated from the unit 700 in the half-cutting step (S405) by cutting through the external terminal 106 down to the sealing agent 107 first and then applying a pressure from the surface of the unit 700 completely reverse to the mounting surface using a roller (not shown) or something similar. Performing a so-called chocolate break eliminates the need for the full-cutting step (S407), thus reducing the number of manufacturing steps of the semiconductor devices 100.

It is possible according to the present invention to provide a semiconductor device with enhanced visual identifiability of a joining agent deposited on external terminals and its manufacturing method.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A semiconductor device comprising:
   an electrically-insulating sealed body forming a mounting surface, a first side surface substantially perpendicular to the mounting surface, a second side surface substantially perpendicular to the first side surface and the mounting surface, a first inclined cut surface disposed between the mounting surface and the first side surface, and a second inclined cut surface disposed between the mounting surface and the second side surface;
   a semiconductor element disposed within said sealed body; and
   first through fourth electrodes disposed within said sealed body and electrically connected to the semiconductor element, the first and second electrodes each being exposed on the mounting surface and the first inclined cut surface, and the third and fourth electrodes each being exposed on the mounting surface and the second inclined cut surface,
   wherein the first and second inclined cut surfaces are linearly or curvedly inclined cut surfaces.

2. A semiconductor device comprising:
an electrically-insulating sealed body forming a mounting surface, a side surface substantially perpendicular to the mounting surface, and an inclined cut surface disposed between the mounting surface and the side surface;
a semiconductor element disposed within said sealed body; and
a plurality of electrodes disposed within said sealed body and electrically connected to the semiconductor element, the plurality of electrodes each being exposed on the mounting surface and the inclined cut surface.

3. The semiconductor device of claim 2, further comprising a die pad, wherein the semiconductor element is electrically connected and fastened to said die pad.

4. The semiconductor device of claim 3, wherein the die pad is comprised of copper (Cu).

5. The semiconductor device of claim 3, wherein the semiconductor element is fastened to said die pad via a die-bonding joining agent selected from the group consisting of silver (Ag) paste, solder, and an adhesive.

6. The semiconductor device of claim 2,
wherein the semiconductor element further comprises electrode pads, and
wherein the plurality of electrodes are electrically connected to the electrode pads via metal wires.

7. The semiconductor device of claim 2, wherein each electrode is comprised of copper.

8. The semiconductor device of claim 2, wherein each electrode further comprises a protruding portion configured to anchor the electrode to the sealed body.

9. The semiconductor device of claim 2, wherein the sealed body is comprised of a resin selected from the group consisting of an epoxy resin, a polyimide thermoplastic resin, and a poly phenylene sulfide thermoplastic resin.

10. The semiconductor device of claim 2, wherein each of the plurality of electrodes are unexposed on the side surface.

11. The semiconductor device of claim 2,
wherein the side surface further includes a first side surface, and second side surface substantially perpendicular to the first side surface and the mounting surface,
wherein the inclined cut surface further includes a first inclined cut surface disposed between the mounting surface and the first side surface, and a second inclined cut surface disposed between the mounting surface and the second side surface,
wherein a first and a second electrode are exposed on the mounting surface and the first inclined cut surface, and
wherein a third and a fourth electrode are exposed on the mounting surface and the second inclined cut surface.

12. The semiconductor device of claim 3, wherein the die pad is exposed on the mounting surface.

13. The semiconductor device of claim 2, wherein each electrode further comprises a plated layer.

14. The semiconductor device of claim 13, wherein the plated layer is selected from the group consisting of a solder-plated layer, a nickel (Ni) plated layer, and a silver (Ag) plated layer.

15. The semiconductor device of claim 2, wherein each of electrodes are exposed on the side surface.

16. The semiconductor device of claim 2, wherein the inclined cut surface is a linearly-inclined cut surface.

17. The semiconductor device of claim 2, wherein the inclined cut surface is a curvedly-inclined cut surface.

18. A method for manufacturing a semiconductor device, comprising:
electrically-connecting a semiconductor element to first through fourth electrodes;
sealing the first through fourth electrodes and the semiconductor element within an electrically-insulating sealed body, with the first through fourth electrodes exposed on a mounting surface of the sealed body;
half-cutting a first inclined cut surface into the sealed body, thereby exposing the first and second electrodes on the first inclined cut surface, the first inclined cut surface being a linearly or curvedly inclined cut surface;
half-cutting a second inclined cut surface into the sealed body, thereby exposing the third and fourth electrodes on the second inclined cut surface, the second inclined cut surface being a linearly or curvedly inclined cut surface;
forming a first side surface into the sealed body, the first side surface being substantially perpendicular to the mounting surface, and the first inclined cut surface disposed between the mounting surface and the first side surface; and
forming a second side surface into the sealed body, the second side surface being substantially perpendicular to the mounting surface and the first side surface, and the second inclined cut surface disposed between the mounting surface and the second side surface.

19. A method for manufacturing a semiconductor device comprising:
electrically-connecting a semiconductor element to a plurality of electrodes;
sealing the plurality of electrodes and the semiconductor element within an electrically-insulating sealed body, with the plurality of electrodes exposed on a mounting surface of the sealed body;
half-cutting an inclined cut surface into the sealed body, thereby exposing the plurality of electrodes on the inclined cut surface; and
forming a side surface into the sealed body, the side surface being substantially perpendicular to the mounting surface, and the inclined cut surface disposed between the mounting surface and the side surface.

20. The method of claim 19, further comprising forming the plurality of electrodes and a die pad on a conductive foil using etching.

21. The method of claim 19, further comprising fastening the semiconductor element onto a die pad using thermosetting.

22. The method of claim 19, further comprising:
affixing a resin sheet to the conductive foil prior to sealing the sealed body; and
removing the resin sheet from the conductive foil after sealing the sealed body.

23. The method of claim 19, further comprising:
affixing a dicing sheet to an upper surface obverse to said mounting surface; and
fastening the dicing sheet to a dicing device.

24. The method of claim 19, wherein the inclined cut surface is half-cut using a blade with a U-shaped or V-shaped edge.

25. The method of claim 19, wherein the inclined cut surface is half of the thickness of the plurality of electrodes.

26. The method of claim 19, further comprising forming plated layers over the plurality of electrodes.

27. The method of claim 19, wherein the plated layers are formed using electrolytic plating.

28. The method of claim 19, wherein forming the side surface into the sealed body further comprises cutting the sealed body to form the side surface.

29. The method of claim 19, wherein forming the side surface into the sealed body further comprises applying pressure to the sealed body to form the side surface.

30. The method of claim 19, wherein the inclined cut surface is a linearly-inclined cut surface.

31. The method of claim 19, wherein the inclined cut surface is a curvedly-inclined cut surface.

* * * * *